(12) United States Patent
Kanai (10) Patent No.: US 8,710,731 B2
(45) Date of Patent: Apr. 29, 2014

(54) METHOD OF PATTERNING COLOR CONVERSION LAYER AND METHOD OF MANUFACTURING ORGANIC EL DISPLAY USING THE PATTERNING METHOD

(75) Inventor: Naoyuki Kanai, Matsumoto (JP)

(73) Assignee: Sharp Kabushiki Kaisha (JP)

( * ) Notice: Subject to any disclaimer, the term of this patent is extended or adjusted under 35 U.S.C. 154(b) by 1353 days.

(21) Appl. No.: 12/375,333

(22) PCT Filed: Jan. 24, 2008

(86) PCT No.: PCT/JP2008/051461
§ 371 (c)(1),
(2), (4) Date: Mar. 31, 2009

(87) PCT Pub. No.: WO2008/091017
PCT Pub. Date: Jul. 31, 2008

(65) Prior Publication Data
US 2009/0230853 A1      Sep. 17, 2009

(30) Foreign Application Priority Data

Jan. 24, 2007   (JP) .................................. 2007-013579

(51) Int. Cl.
*H01J 1/62* (2006.01)
*H01J 63/04* (2006.01)

(52) U.S. Cl.
USPC ........... 313/504; 313/483; 313/500; 313/501; 313/502; 313/503; 313/505; 313/506

(58) Field of Classification Search
None
See application file for complete search history.

(56) References Cited

U.S. PATENT DOCUMENTS

| 6,072,450 | A | 6/2000 | Yamada et al. |
| 6,781,304 | B2 | 8/2004 | Yano et al. |
| 7,034,332 | B2 * | 4/2006 | Stasiak et al. .................... 257/40 |
| 7,294,965 | B2 * | 11/2007 | Kobayashi et al. ........... 313/506 |
| 7,335,579 | B2 * | 2/2008 | Stasiak et al. .................. 438/584 |
| 7,598,672 | B2 * | 10/2009 | Nakajima ...................... 313/512 |
| 8,044,570 | B2 * | 10/2011 | Oyaizu et al. ................. 313/501 |
| 8,057,072 | B2 * | 11/2011 | Takenaka et al. ......... 362/311.02 |
| 8,304,265 | B2 * | 11/2012 | Nakamura et al. ............... 438/29 |
| 8,408,724 | B2 * | 4/2013 | Ogawa et al. .................... 362/84 |
| 8,446,091 | B2 * | 5/2013 | Nakamura et al. ............ 313/504 |

(Continued)

FOREIGN PATENT DOCUMENTS

| CN | 1656852 A | 8/2005 |
| JP | 10-162958 A | 6/1998 |

(Continued)

OTHER PUBLICATIONS

Notice on the First Office Action issued in corresponding Chinese Patent Application No. 200880000684.8 dated Apr. 22, 2010.

(Continued)

*Primary Examiner* — Natalie Walford
(74) *Attorney, Agent, or Firm* — Rossi, Kimms & McDowell LLP (57) ABSTRACT

A method of patterning a color conversion layer for an organic EL device is provided together with a method of manufacturing a multiple color emitting organic EL display using the patterning method. The patterning method includes forming the color conversion layer on a base having an organic layer and patterning the color conversion layer by carrying out a thermal cycle nano imprint technique.

22 Claims, 3 Drawing Sheets

(56) References Cited

U.S. PATENT DOCUMENTS

| | | | |
|---|---|---|---|
| 2001/0043043 A1 | 11/2001 | Aoyama et al. | |
| 2004/0135502 A1* | 7/2004 | Kobayashi et al. | 313/506 |
| 2005/0248929 A1 | 11/2005 | Kawamura et al. | |
| 2006/0158403 A1 | 7/2006 | Kuma | |
| 2006/0197095 A1 | 9/2006 | Nakajima | |
| 2009/0239103 A1* | 9/2009 | Hasegawa et al. | 428/847.1 |
| 2012/0301608 A1* | 11/2012 | Landis | 427/133 |

FOREIGN PATENT DOCUMENTS

| | | |
|---|---|---|
| JP | 2000-230172 A | 8/2000 |
| JP | 2002-075643 A | 3/2002 |
| JP | 2003-217859 A | 7/2003 |
| JP | 2004-014236 A | 1/2004 |
| JP | 2005-158584 A | 6/2005 |
| JP | 2005-190667 A | 7/2005 |
| JP | 2005-251525 A | 9/2005 |
| JP | 2005-309174 A | 11/2005 |
| JP | 2006-244945 A | 9/2006 |
| WO | 2006/009039 A1 | 1/2006 |

OTHER PUBLICATIONS

International search report issued in corresponding PCT/JP2008/051461, mailed Mar. 11, 2008.

* cited by examiner

METHOD OF PATTERNING COLOR CONVERSION LAYER AND METHOD OF MANUFACTURING ORGANIC EL DISPLAY USING THE PATTERNING METHOD

CROSS REFERENCE TO RELATED APPLICATIONS

This application claims priority from Japanese Patent Application No. JP 2007-013579, filed on Jan. 24, 2007, the contents of which are incorporated herein by reference in their entirety.

TECHNICAL FIELD

The present invention relates to a method of patterning a color conversion layer in an organic EL display. The invention also relates to a method of manufacturing an organic EL display that emits light of at least one of the primary colors, in which a color conversion layer is patterned with a pixel shape using the aforementioned method of patterning a color conversion layer.

BACKGROUND ART

Active studies have been carried out in recent year regarding the commercialization of organic EL devices. An organic EL device enables a high current density with a low applied voltage to achieve the realization of high light emitting luminance and high light emission efficiency. Therefore, commercialization of a multiple-color light emission organic EL display has particularly been anticipated which can provide a highly precise multiple-color or full-color display.

One example of a method of providing a multiple-colored or full colored organic EL display is the "color filter method", wherein a plurality of kinds of color filter layers transmitting light in wavelength regions specific to the respective kinds are employed. When applying the color filter method, the organic EL device to be used is required to emit light with multiple colors for so-called "white light" including well balanced primary colors (red (R), green (G) and blue (B)).

Various methods have been examined to obtain a multiple color light emission EL device such as: (1) a method of using a light emitting layer including a plurality of light emitting materials for simultaneously exciting a plurality of the light emitting materials, (2) a method of using a light emitting layer including host light emitting material and guest light emitting materials for exciting the host light emitting material to emit light and simultaneously causing energy transfer to the energy levels of the guest materials for resulting light emission, (3) a method of using a plurality of light emitting layers each including a different light emitting material for exciting the light emitting material in each layer, and (4) a method of using a light emitting layer, including light emitting materials, and a carrier transporting layer, adjacent to the light emitting layer and including light emitting dopants, for producing excitons by carrier recombination in the light emitting layer to transfer part of excitation energy to the light emitting dopants from the produced excitons.

In the above-explained multiple color light emission organic EL device, however, the light emission relies on either simultaneous excitation of a plurality kinds of light emitting materials or energy transfer among a plurality kinds of light emitting materials. It has been reported that in such a device the balance in light emitting intensity among light emitting materials varies, which causes possible changes in hues that are obtained.

As a method for obtaining a multiple color light emission organic EL device, a color conversion method has been proposed which uses an organic EL device emitting monochromatic light and a color conversion layer also referred to as a fluorescence conversion layer, a phosphor thin film or a fluorescent material film (see, for example, JP-A-2002-075643 corresponding to US Patent Application Publication No.: US2001/0043043 A1 (film deposition with the use of a metal mask), JP-A-2003-217859 corresponding to U.S. Pat. No. 6,781,304 B2, and JP-A-2000-230172). The color conversion layer being used is a layer including one or a plurality of kinds of color conversion material absorbing light with a short wavelength to convert the light to light with a long wavelength.

As a method of forming a color conversion layer, a method has been studied which is like that of depositing color conversion material by a dry process such as evaporation or sputtering to obtain a thickness equal to or less than 2000 nm, preferably on the order of from 300 nm to 600 nm (see, for example, JP-A-2002-075643 corresponding to US Patent Application Publication No.: US2001/0043043 A1). When forming a color conversion layer by evaporation, a film formed on the whole surface of a display surface makes it impossible to emit light which is resolved into each of the primary colors. Therefore, it becomes necessary to separately form fine patterns each corresponding to a specified pixel by a method of some kind. At present, as a method of separately patterning a thin film of deposited material, a patterned deposition method using a metal mask has been employed. However, although the method of forming a deposition pattern using a metal mask has long been known, in preparing finer mask patterns, limitation in the material and the thickness of the mask limits the level of definition of the mask pattern to 150 to 200 pixels per inch (ppi). Attempting to provide pattern with a definition higher than 150 to 200 ppi, results in problems of increasing complexity, makes it impossible to obtain a higher definition pattern for a large area, and also results in a reduction in yield. For example, the thickness required for a metal mask is around 50 microns in order to provide sufficient strength, but this thickness limits the size of potential openings in the metal mask pattern. Further, differences in the thermal expansion coefficients between the metal mask and the substrate cause alignment problems. Large size metal masks (for example on the order of 730 mm×920 mm) may be misaligned up to several tens of microns due to flexing and expansion problems.

In the case of patterning an organic film, application of a nano imprint technique has been proposed and studied. For example, there is a proposal for applying resist material on a hard substrate and pressing an original form having a specified pattern with protrusions and hollows onto the resist to form electrode separation walls (see, for example, JP-A-2005-158584). Patterning can be provided because of the use of a resist material that has a high fluidity. However, for a color conversion layer formed by deposition or formed only of dyes, it would be difficult to form a desired pattern because of lack of fluidity and a small thickness, on the submicron order, of the color conversion layer.

In view of the above, it would be desirable to provide a patterning method that can be carried out, without using a metal mask, to form a color conversion layer with a fine pattern while avoiding high definition problems and, additionally, to provide a method of manufacturing an organic EL display panel of a color conversion system that emits light with multiple color by using a color conversion layer having the fine pattern.

DISCLOSURE OF THE INVENTION

The invention provides a method of patterning a color conversion layer for an organic EL device in which the color conversion layer absorbs light of a first wavelength and emits light including a second wavelength that differs from the first wavelength.

The method of the invention includes forming the color conversion layer on top of a base and patterning the color conversion layer by carrying out a thermal cycle nano imprint technique. In addition, oxygen plasma processing can be performed after patterning the color conversion layer, which itself is preferably formed using vacuum evaporation. In a preferred embodiment, the color conversion layer consists essentially of a color conversion material.

Additionally, a color filter layer is formed on a surface of the base and a planarization layer is formed on top of the color filter layer. The color conversion layer is formed over the planarization layer.

A protecting layer can be optionally provided between the color conversion layer and the planarization layer to protect the underlying device structures during the patterning process.

The thermal cycle nano imprint technique used to perform the patterning of the color conversion layer includes heating a mold formed with a fine pattern, bringing the mold into contact with the color conversion layer, and pressing the mold into the color conversion layer to transfer the fine pattern of the mold onto the color conversion layer. In order to obtain the best results, the mold is preferably heated to a temperature within a range of the glass transition temperature of the color conversion layer (Tg)±25° C.

The forming the color conversion layer and the patterning the color conversion layer are preferably carried out in an inline vacuum process in order to maximize quality and yield. The inline vacuum process moves work pieces between various process stations while maintaining a vacuum. The inline vacuum process provides superior results over loading work pieces into separate containers (usually containing an inert gas), moving the containers to the next process station, and then unloading the work pieces at the next process station.

The above-described method of patterning the color conversion layer is utilized in methods of producing organic EL displays with superior characteristics. For example, in one preferred method, at least two kinds of color filter layers, each transmitting light in a different wavelength region, are provided on a base. A planarization layer is then formed over the color filter layers, and a color conversion layer is formed over the planarization layer. Patterning the color conversion layer is carried out utilizing a thermal cycle nano imprint technique as described above. A barrier layer is then preferably formed over the patterned color conversion layer.

An organic EL device can then be formed over the barrier layer or bonded to the structure. For example, in one illustrated embodiment, the base, color filter layers, planarization layer, color conversion layer and barrier layer define a color conversion filter structure, and the color conversion filter structure is bonded to a top emission type EL device.

Alternatively, a method of manufacturing an organic EL display in accordance with the invention includes: providing a color filter structure by providing at least two kinds of color filter layers, each transmitting light in a different wavelength region, on a base, forming a planarization layer over the color filter layers, and forming a first barrier layer over the planarization layer; providing an organic EL device by forming an organic EL layer on a device substrate, forming a color conversion layer over the organic EL layer, wherein the color conversion layer absorbs light of a first wavelength and emits light including a second wavelength that differs from the first wavelength, patterning the color conversion layer by carrying out a thermal cycle nano imprint technique, and forming a second barrier layer over the color conversion layer; and bonding the color filter structure to the organic EL device so that the first barrier layer and the second barrier layer are opposite to each other.

The above manufacturing methods can be used in accordance with the invention to produce an organic EL display having a transparent substrate, at least two kinds of color filter layers, each transmitting light in a different wavelength region, located on the a surface of a base, a planarization layer located over the color filter layers, and a color conversion layer including an array of pixel elements that are aligned with and correspond to at least one of the color filter layers.

Each of the pixel elements has a width less than 50 μm, which could not be obtained using conventional manufacturing processes.

Further, each of the pixel elements has an inter-pixel spacing of 5 μm or less, which also could not be obtained using conventional manufacturing processes.

In the illustrated embodiments, the pixel elements constitute sub-pixel elements of color pixels of the display. However, the invention is also applicable to devices that are monochromatic, in which case the pixel elements all correspond to a single color.

The invention further provides for variations in device structure. For example, the color conversion layer may be located over the planarization layer, and a barrier layer may be located over the color conversion layer and an organic EL layer located over the barrier layer.

Alternatively, the color conversion layer is located over the planarization layer and a barrier layer is located over the color conversion layer, wherein the base, color filter layers, planarization layer, color conversion layer and the barrier layer define a color conversion filter structure, and wherein the color conversion filter structure is bonded to an organic EL device.

Still further, an organic EL display in accordance with the invention may include an organic EL device located on a device substrate, a first barrier layer located over the planarization layer, and a second barrier layer located over the color conversion layer, wherein the color conversion layer is located over the organic EL device, wherein the base, color filter layers, planarization layer and first barrier layer comprise a color filter structure, wherein the device substrate, organic EL device, color conversion layer and the second barrier layer comprise an organic EL device structure, and wherein the color filter structure is bonded to the organic EL device structure such that the first barrier layer and the second barrier layer are opposite to each other.

By using the patterning method according to the invention the color conversion layer can be formed as a continuous film (a solid film) when depositing the color conversion layer. Therefore, there is no necessity for the use of a metal mask which causes problems in precision and resolution as found in conventional processes. Thus, the color conversion layer can be formed into a fine pattern having a pixel resolution that could not be obtained by previous methods. In addition, the invention can produce displays having a large surface area also previously unobtainable by conventional methods. For example, while a conventional metal mask may be able to produce arrays up to 550 mm×650 mm, the invention can produce arrays of much larger dimensions including arrays having at least one dimension greater than 650 mm. As a result, a high definition display can be easily and economically manufactured by patterning the color conversion layer in accordance with the invention.

BRIEF DESCRIPTION OF THE DRAWINGS

The invention will be described with reference to certain preferred embodiments thereof and the accompanying drawings, wherein.

BEST MODE FOR CARRYING OUT THE INVENTION

The invention provides a method of patterning a color conversion layer for an organic EL device absorbing light with a certain wavelength and emitting light including a wavelength that differs from the wavelength of the absorbed light. The patterning of the color conversion layer is carried out by a patterning method characterized by: forming the color conversion layer on a base having an organic layer; and patterning the color conversion layer by carrying out a thermal cycle nano imprint technique in which a mold formed with a fine pattern is heated and brought into contact with the color conversion layer and pressed thereto to deform the color conversion layer to thereby transfer the fine pattern of the mold onto the color conversion layer, wherein the mold is heated to a temperature within a range of the glass transition temperature of the color conversion layer (Tg)±25° C., and wherein carrying out the forming the color conversion layer and the patterning the color conversion layer is preferably performed in an inline vacuum process.

In the following description, the invention will be explained by using an example of the manufacturing flow of a bottom emission type organic EL display of passively driven as illustrated in FIGS. 1A-1J.

Figure 1A:
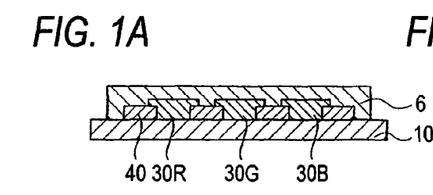
FIGS. 1A-1J are cross-sectional views showing an example of the flow of manufacturing process steps of a bottom emission type organic EL display of passive driving according to the invention.

As shown in FIG. 1A, black matrices 40 and color filter layers 30R, 30G and 30B are arranged on a transparent substrate 10 which acts as a base. A planarization layer 6 is provided over the black matrices 40 and color filter layers 30R, 30G and 30B to form a laminate structure.

The material for the transparent substrate 10 used for the display according to the invention is highly transparent to light and resistant to conditions (solvents, temperatures etc.) for forming the black matrices 40, the color filter layers 30R, 30G and 30B, and a color conversion layer 20 and an organic EL device (electrodes, an organic light emitting layer etc.) both of which will be explained later. Furthermore, the material is preferably excellent in dimensional stability. In addition, it is only necessary that the material causes no degradation in performance of a multiple color light emitting display. For example, glass, various kinds of plastics and various kinds of films may be utilized.

The color filter layers 30R, 30G and 30B can be formed by using material used for a flat panel display such as a liquid crystal display. In recent years, pigment dispersed material is often used in which pigment is dispersed in a photoresist. Color filter layers for a flat display panel are generally provided by disposing a blue color filter layer transmitting light at wavelengths from 400 nm to 550 nm, a green color filter layer transmitting light at wavelengths from 500 nm to 600 nm and a red color filter layer transmitting light at wavelengths of 600 nm or more.

By optionally disposing the black matrices 40 that transmit no light in the visible wavelength range between sub-pixels of respective color filter layers, contrast in a display can be enhanced. The black matrix 40 can be formed by using materials commonly employed in the manufacture of an ordinary flat panel display.

The planarization layer 6 is disposed over the color filter layers 30R, 30G and 30B for the purpose of protecting the color filter layers. In addition, as the name suggests, the planarization layer 6 is also disposed with the purpose of planarization of the film surface. Therefore, it is necessary to select a material that is highly transparent to light and allows the color filter layers 30R, 30G and 30B to be disposed without being deteriorated, and to select the process that can form the planarization layer 6 without deteriorating such characteristics. The planarization layer 6 is generally formed by coating.

The material applicable to forming the planarization layer 6 is generally a material for which photo-setting resin or photo-thermo-setting resin is subjected to photo-treatment and/or heat treatment to produce radical species and ionic species for polymerization or cross-linking to be made insoluble and infusible. In addition, the photo-setting or photo-thermo-setting resin is preferably soluble in organic solvent or alkaline solution before being subjected to setting.

Specifically, the photo-setting or photo-thermo-setting resin includes (1) a composition comprising acrylic polyfunctional monomer and oligomer having a plurality of acryloyl groups and/or methacryloyl groups and photopolymerization or thermopolymerization initiator, (2) a composition of polyvinyl cinnamate and sensitizer, (3) a composition of linear or cyclic olefin and bisazide or (4) a composition comprising monomer having epoxy group and a photo-acid generator and the like. In particular, the photo-setting or photo-thermo-setting resin (1) described above is preferable in capability of high definition patterning also in reliability such as resistance to solvents and resistance to heat.

In addition, there can be also used thermoplastic resin such as polycarbonate (PC), polyethylene terephthalate (PET), polyether sulfone, polyvinyl butyral, polyphenylene ether, polyamide, polyether imide, norbornene resin, methacrylate resin, isobutylene maleic anhydride copolymer resin or cyclic olefin. In addition, a thermosetting resin such as epoxy resin, phenolic resin, urethane resin, acrylic resin, vinyl ester resin, imide resin, urethane series resin, urea resin or melamine resin can be utilized. Still further, a polymer hybrid including trifunctional or tetrafunctional alkoxysilane together with polystyrene, polyacrylonitrile or polycarbonate can be employed.

Figure 1B:
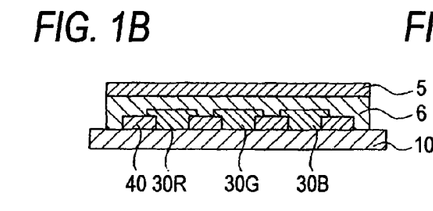

Next, as shown in FIG. 1B, a protection layer 5 is provided on the upper surface of the planarization layer 6 of the laminate shown in FIG. 1A. The protection layer 5 is a layer optionally provided between the planarization layer 6 and a color conversion layer 20 that will be explained later. The planarization layer 6, when the color conversion layer 20 is patterned to be formed into a red color conversion layer 20R by a thermal cycle nano imprint technique according to the invention that will be described later, can be patterned together with the color conversion layer 20. The planarization layer 6 may be protected during this process by providing the protection layer 5.

A material with high transparency in the visible region (transmissivity of 50% or more in the wavelength range from 400 to 700 nm) can be used for the protection layer 5. In addition, a material having film hardness of 2H (measured according to Japan Industrial Standard (JIS) K5600-5-4) or more is preferably used, which is the required hardness to allow the protection layer 5 to withstand the work processing of the thermal cycle nano imprint technique. Examples of materials that can be used include inorganic oxide or inorganic nitride such as SiOx, SiNx, SiNxOy, AlOx, TiOx, TaOx, ZnOx, SnO$_2$, ITO, In$_2$O$_3$, IZO, zinc-aluminum oxide or zinc-gallium oxide. There is no particular limitation to the method of forming the protection layer 5. Accordingly, the protection layer 5 can be formed by methods such as sputtering, CVD and vacuum evaporation. Further, the protection layer 5 can be either a single layer or a laminate of a plurality of layers.

Figure 1C:
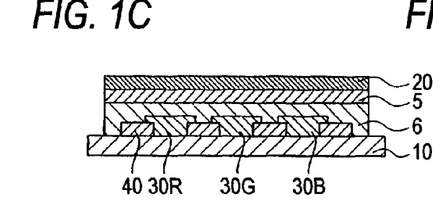

Then, as shown in FIG. 1C, the color conversion layer 20 is provided on the upper surface of the protection layer 5. Since the protection layer 5 is an optionally provided layer (in other words an optional layer), when no protection layer 5 is provided, the color conversion layer 20 can be provided directly on the planarization layer 6.

The color conversion layer 20 is a layer formed of one kind of color conversion material or a plurality of kinds of color conversion materials. The layer preferably has a thickness equal to or less than 1 µm, and more preferably 200 nm to 1 µm. The color conversion layer 20 is formed by a dry process and preferably, by vacuum evaporation. The heating form in the vacuum evaporation can be either a direct heating form or an indirect heating form, for which such a form as resistance heating, electron beam heating or infrared heating can be used. When the color conversion layer 20 is formed by using a plurality of different kinds of color conversion materials, a preliminary mixture is prepared beforehand with a plurality of different kinds of color conversion materials mixed in specified proportions and co-evaporation may be carried out by using the preliminary mixture. Alternatively, with a plurality of different kinds of color conversion materials disposed at heating positions separately provided from one another, co-evaporation may be carried out by separately heating the respective color conversion materials. In particular, when there are large differences in characteristics (such as evaporation speeds and vapor pressures) among a plurality of different kinds of the color conversion materials, the latter is effective.

The color conversion material is a dye which absorbs light in the near ultraviolet region to the visible region emitted from a light source to perform wavelength distribution conversion and emits visible light with different wavelengths. In particular, it is preferable for the color conversion material to absorb light in the blue to the blue-green region.

A variety of materials can be used for the color conversion material forming the color conversion layer 20 including: aluminum chelate pigments such as tris(8-hydroxy quinolinato)aluminum (Alq$_3$); coumarin dyes such as 3-(2-benzothiazolyl)-7-diethylamino-coumarin (coumarin 6), 3-(2-benzoimidazolyl)-7-diethylamino-coumarin (coumarin 7) or coumarin 135; naphthalimide dyes such as solvent yellow 43 or solvent yellow 44; cyanine dyes such as 4-dicyanomethylene-2-methyl-6-(p-dimethylaminostyryl)-4H-pyran (DCM-1 (I)), DCM-2 (II) or DCJTB (III); xanthene dyes such as rhodamine B or rhodamine 6G; pyridine dyes such as pyridine 1; or 4,4-difluoro-1,3,5,7-tetraphenyl-4-bora-3a, 4a-diaza-s-indacene (IV), Lumogen F Red or Nile Red (V). Moreover, host-guest materials used in light emitting layers in publicly known various kinds of ELs may be used for color conversion materials.

-continued (V)

Next, detailed explanation will be made regarding the patterning of the color conversion layer with reference to FIGS. 1D to 1F. In accordance with the invention, a nano imprint technique is utilized as a method of patterning the red color conversion layers 20R spaced on the order of microns apart in a wide area. The nano imprint technique is originally a technique by which a mold formed with a fine pattern is brought in contact with an applied resist and pressed thereto to thereby deform the resist and transfer the fine pattern onto the surface of the resist. In the invention, a thermal cycle nano imprint technique is preferably used by which the color conversion layer 20, deposited with the use of color conversion material exhibiting glass transition, is heated at a temperature higher than the temperature around its glass transition temperature Tg of the color conversion material but lower than its decomposition temperature or its evaporation temperature in order to make it soft.

Figure 1D:
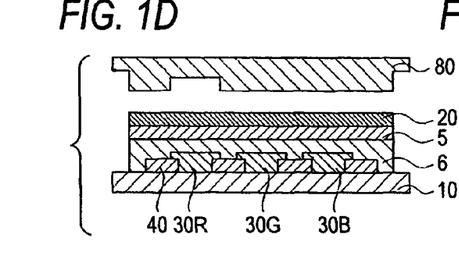
Figure 1E:
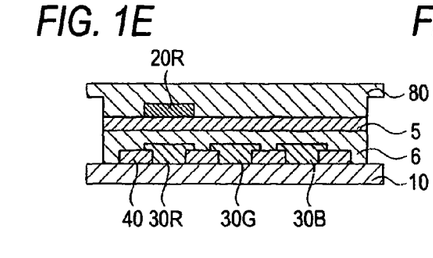
Figure 1F:
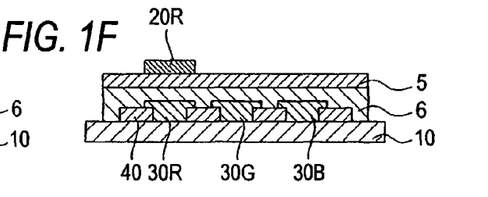

First, as shown in FIG. 1D, a mold 80, with its pattern of protrusions and hollows, is positioned opposed to the color conversion layer 20. Here, the mold 80 is an example of just one type of mold that may be used in accordance with the invention. Next, as shown in FIG. 1E, the mold 80 is heated at a specified temperature and brought into contact with and pressed into the color conversion layer 20. At this time, the color conversion layer 20 is deformed together with deformation of organic layers (the layers such as the color filter layers 30R, 30G and 30B and the planarization layer 6) presented beneath the color conversion layer 20 to flow into the hollows in the mold 80. The formed laminate is then cooled to provide the patterned color conversion layer obtained (in the example, the red color conversion layer 20R) by the thermal cycle nano imprint technique as shown in FIG. 1F.

The heating temperature of the mold 80 is set at a temperature higher than the temperature around the glass transition temperature (Tg) of the color conversion layer 20. The heating temperature is preferably equal to or more than Tg−25° C. Here, the Tg of the color conversion layer is referred to as the Tg of the color conversion material forming the color conversion layer 20. The heating temperature set within the specified range enhances the flow characteristics of the color conversion material to allow the dye to sufficiently flow in the layer, thereby enabling a color conversion layer with a desired pattern to be easily obtained. Moreover, the heating temperature of the mold 80, even though the heating temperature is within the above range, is desirably set to be lower than the decomposition temperature of the color conversion material, preferably 50° C. or more lower than the decomposition temperature. This is because the mold 80 heated to the decomposition temperature of the color conversion material or higher causes the dye to be decomposed. Here, the decomposition temperature of the color conversion material can be determined by measurement with the thermogravimetry-differential thermal analysis (TG-DTA) or the thermogravimetry mass spectroscopy (TGMS). Similarly, the mold 80 heated to the evaporation temperature of the color conversion material or higher causes the color conversion material to evaporate. Hence, the heating temperature of the mold 80, even though the heating temperature is within the above range, is desirably set to be lower than the evaporation temperature of the color conversion material. More preferably, the heating temperature of the mold 80 is within the range of Tg±25° C. With the heating temperature set within the range, it becomes possible to prevent the pattern from being deformed due to contraction at cooling. The heating temperature of the mold 80 when a plurality of color conversion materials are included in the color conversion layer 20 is set with Tg and the evaporation temperature of the color conversion material as a main component of the color conversion layer taken into consideration.

Figure 4:
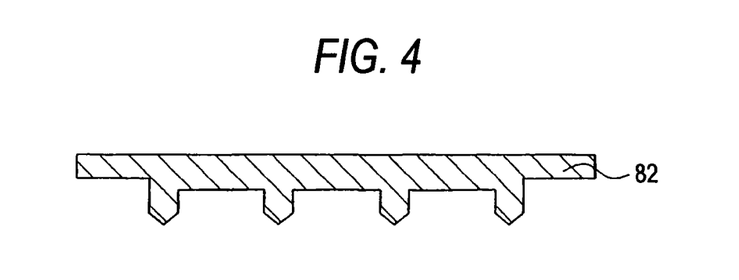
FIG. 4 is a cross sectional view showing an example of a mold used in the invention with protrusions being modified.
Figure 5:
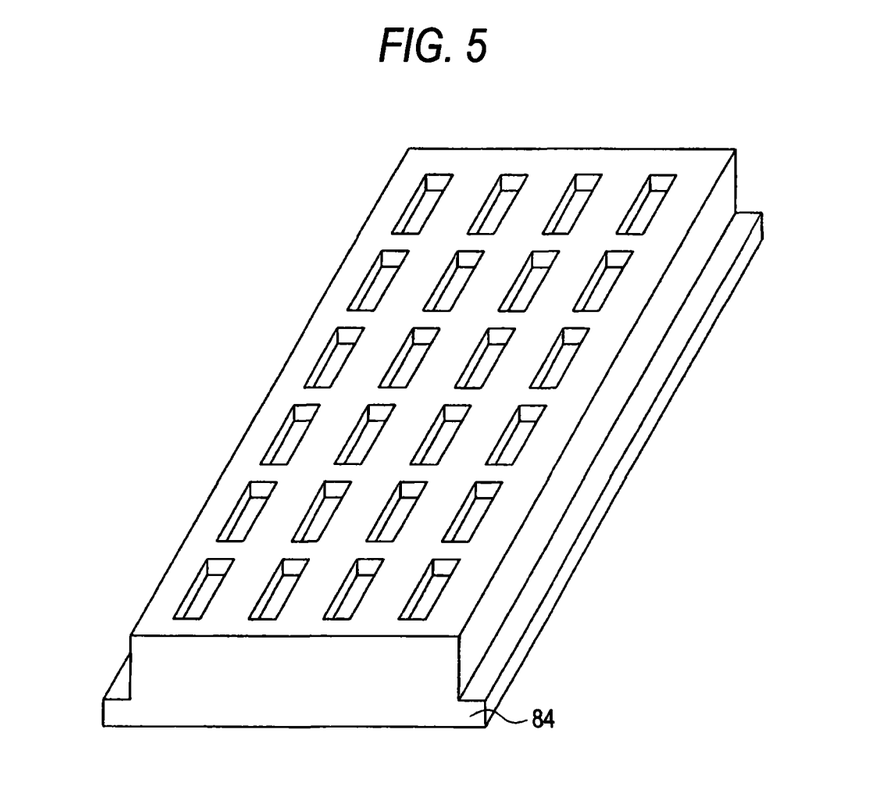
FIG. 5 is a perspective view showing an example of an arrangement of hollows and protrusions as a pattern of a mold used in the invention.

The mold 80 is preferably made of a material which is resistant to a heating temperature, has a sufficient hardness, and is capable of having a pattern on the order of microns formed on the mold surface. Therefore, materials such as quartz, metal, silicon, ceramic and resin can be used for the mold 80. The fine pattern onto the mold 80 can be formed by etching with a material such as resist or inorganic oxide film used as a mask. The depth of the hollow on the mold 80 is made larger than the thickness of the color conversion layer 20. When the mold 80 is brought into contact and pressed into the color conversion layer 20, a space presented between the bottom surface of the hollow of the pattern on the mold 80 and upper surface of the protrusion formed in the color conversion layer 20 facilitates pulling the mold 80 up for separation. Moreover, the pattern of the mold 80 can be provided as that with desired hollows and protrusions (a mold 84) as shown, for example, in a perspective view illustrated in FIG. 5. Here, like an example of a mold (a mold 82) used in the invention as shown in a cross sectional view in FIG. 4, a pattern formed with protrusions each being modified to have wedge-like inclination is further preferable because the inclination assists the flow of the color conversion material. With such a pattern, the organic layers beneath the color conversion layer is adequately deformed along the wedge surface to act so as to push out the color conversion material toward the hollow of the mold to easily form the pattern of the color conversion layer. Moreover, the surface of the mold 80 may be fluorine-coated for lowering adherence of the mold 80 to the color conversion layer 20 so that the patterned section on the color conversion layer 20 provided by the mold 80 is not separated together with the mold 80 when the mold 80 is pulled up for being separated from the color conversion layer 20. When the pressing by the mold 80 to form the fine pattern might cause a problem by damaging the base layer (planarization layer 6), the protection layer 5 may be provided as was explained in the foregoing.

The patterning of the color conversion layer 20 according to the invention is preferably carried out in a vacuum (10-4 Pa or less in the invention) or an inert gas atmosphere. The color conversion material, being of organic material, is not resistant to moisture and oxygen. Moreover, particles, foreign materials with sizes of the order of approximately microns that bring about defects in image, affect a leak that makes a current always flow out when the color conversion layer is formed into a panel with the particles adhered thereto. Therefore, the patterning is preferably carried out in a vacuum. In this case, transfer of the laminate in the vacuum (inline vacuum process) to a chamber, where patterning is carried out following the deposition of the color conversion layer 20, results in particles, moisture and oxygen having little influence on the color conversion layer 20. However, when the color conversion layer 20 is resistant to moisture and oxygen and with proper measures taken against particles, patterning can be carried out in air if so desired.

In the invention, when the color conversion layer 20 remains at respective positions corresponding to the blue color filter layer 30B and the green color filter layer 30G (i.e. a blue sub-pixel and a green sub-pixel), the remaining color conversion layers are desirably removed as necessary. This is because, when the color conversion layer 20 remains at the respective positions of the blue sub-pixel and the green sub-pixel, the brightness of each of the blue sub-pixel and the green sub-pixel is reduced. Oxygen plasma processing, nitrogen plasma processing or dry etching can be used to remove the remaining color conversion layer 20. In particular, the use of oxygen plasma processing is preferable. When carrying out the removing processing, the red color conversion layer 20R at the position of the red sub-pixel is also affected by the processing. Therefore, in the step of forming the color conversion layer 20 shown in FIG. 1C, the color conversion layer 20 is desirably formed to be thicker than the necessary thickness. When no problem occurs in a displaying performance even though the color conversion layer 20 remains at the position of each of the green and blue sub-pixels, the removal of the remaining color conversion layer can be omitted.

Figure 1G:
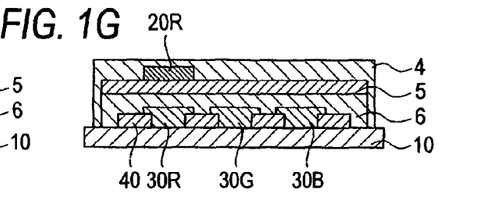

Following this, as shown in FIG. 1G, a first barrier layer 4 is formed while covering the red color conversion layer 20R. As was explained before, color conversion materials, being organic material, are not resistant to moisture and oxygen. Thus, the color conversion materials must be protected from moisture and oxygen. Here, as shown in FIG. 1G, a first barrier layer 4 may be formed so as to cover the red color conversion layer 20R and underlying layers thereof. The arrangement is also effective for protecting an organic EL device that will be explained later. For the material of the first barrier layer 4, a material can be used which has electrical insulation properties, barrier properties against gas and organic solvents and high transparency in the visible region (transmissivity of 50% or more within the wavelength ranges from 400 to 700 nm). For the first barrier layer 4, a material may be used which preferably has film hardness of 2H or more as the hardness of making the first barrier layer 4 capable of withstanding deposition of a transparent electrode 2 that will be explained later. For example, inorganic oxide or inorganic nitride, such as SiOx, SiNx, SiNxOx, AlOx, TiOx, TaOx or ZnOx, can be used for the first barrier layer 4. There is no particular limitation to the method of forming the first barrier layer 4, so that the first barrier layer 4 can be formed by methods such as sputtering, CVD and vacuum evaporation. The first barrier layer 4 can be either a single layer or a laminate of a plurality of layers.

Figure 1H:
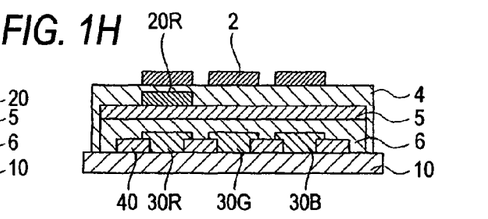
Figure 1I:
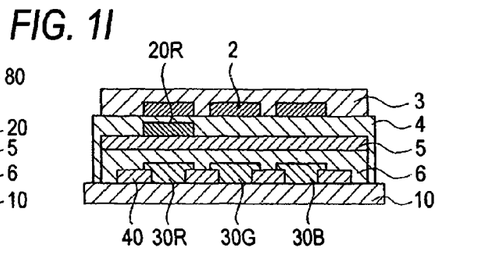
Figure 1J:
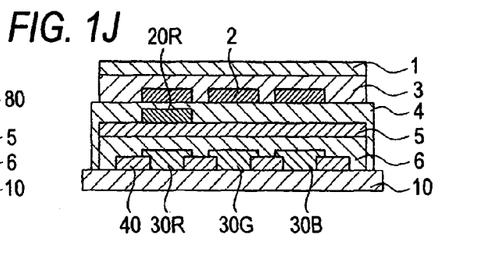

Finally, as shown in FIGS. 1H to 1J, an organic EL device is provided on the upper surface of the first barrier layer 4. In the invention, the organic EL device is formed of an organic EL layer 3 and electrodes (transparent electrodes 2 and a reflective electrode 1 that will be explained later). First, as shown in FIG. 1H, transparent electrodes 2 are disposed on the upper surface of the first barrier layer 4. Each of the transparent electrodes 2 can be formed by using ITO, tin oxide, indium oxide, IZO, zinc oxide, zinc-aluminum oxide, zinc-gallium oxide or conductive transparent metal oxide with a dopant such as F or Sb added to any one of these oxides. The transparent electrode 2 can be formed by deposition with the use of evaporation, sputtering or chemical vapor deposition (CVD) before being patterned with the use of technique such as photolithography. The transparent electrode 2, however, is preferably formed with the use of sputtering.

The transparent electrode 2 can be either an anode or a cathode. When the transparent electrode 2 is used as a cathode, a cathode buffer layer can be provided between the transparent electrode 2 and the organic EL layer 3 to enhance electron injecting efficiency. The cathode buffer layer can be formed from alkaline metal such as Li, Na, K or Cs, alkaline earth metal such as Ba or Sr, an alloy including such alkaline metal or alkaline earth metal, rare earth metal or fluoride of such metal. From the view point of ensuring transparency, the thickness of the cathode buffer layer is desirably determined to be 10 nm or less.

As shown in FIG. 1I, an organic EL layer 3 is provided on the upper surface of the transparent electrode 2. In the invention, the organic EL layer 3 has a structure in which at least an organic light emitting layer is included with a hole injecting layer, a hole transporting layer, an electron transporting layer and/or an electron injecting layer which are/is made to intervene as necessary. Specifically, the following layer structure is adopted as that of an organic EL device.

(1) anode/organic light emitting layer/cathode
(2) anode/hole injecting layer/organic light emitting layer/cathode
(3) anode/organic light emitting layer/electron injecting layer/cathode
(4) anode/hole injecting layer/organic light emitting layer/electron injecting layer/cathode
(5) anode/hole transporting layer/organic light emitting layer/electron injecting layer/cathode
(6) anode/hole injecting layer/hole transporting layer/organic light emitting layer/electron injecting layer/cathode
(7) anode/hole injecting layer/hole transporting layer/organic light emitting layer/electron transporting layer/electron injecting layer/cathode Commonly known materials can be used for each of the layers forming the organic EL layer 3. Moreover, each of the layers making up the organic EL layer 3 can be formed by any method known in the technical field such as evaporation.

A fluorescent brightener in a series such as benzothiazole series, benzoimidazole series or benzo-oxazole series, or material such as metal chelate oxonium compound, styrylbenzene series compound or aromatic dimethylidyne series compound is preferably used for the material of the organic light emitting layer to obtain light emission ranging from blue to blue-green. Moreover, light emission in the organic light emitting layer may be white light emission as necessary. In such a case, publicly known red dopant is used.

As shown in FIG. 1J, a reflective electrode 1 is provided on the upper surface of the organic EL layer 3, by which an organic EL display of bottom emission type passive matrix driving is obtained. The reflective electrode 1 is preferably formed by using metal, an amorphous alloy or a micro crystalline alloy, each with high reflectance. The metal with high reflectance includes metal such as Al, Ag, Mo, W, Ni or Cr. The amorphous alloy with high reflectance includes an alloy such as NiP, NiB, CrP or CrB. The micro crystalline alloy with high reflectance includes an alloy such as NiAl. The reflective electrode 1 can be used as either a cathode or an anode. When the reflective electrode 1 is used as a cathode, the above-explained cathode buffer layer can be provided at the interface between the reflective electrode 1 and the organic EL layer 3 for enhancing an efficiency of electron injection to the organic EL layer. Alternatively, the electron injecting efficiency can be enhanced by adding material with a small work function to the above-explained metal, amorphous alloy or a micro crystalline alloy, each with high reflectance, for being alloyed. Such material with a small work function is shown as alkaline metal such as lithium, sodium or potassium or alkaline earth metal such as calcium, magnesium or strontium. While, when the reflective electrode 1 is used as an anode, a layer of the above-explained conductive transparent metal oxide can be also provided between the reflective electrode 1 and the organic EL layer 3 to enhance the efficiency of hole injection to the organic EL layer 3.

The reflective electrode 1 can be formed by any measures known in the technical field depending on material to be used. The measures is shown as such one as vacuum evaporation, sputtering, ion plating or laser ablation. As will be explained later, when the reflective electrode 1 necessitates to be formed of a plurality of partial electrodes, the reflective electrode 1 formed of a plurality of partial electrodes can be formed by using masks giving desired shapes.

As explained above, the organic EL device used in the display according to the invention is formed of the transparent electrode 2, the organic EL layer 3 and the reflective electrode 1. Here, the organic EL device with the arrangement according to the invention can be provided with a plurality of light emitting sections each being independently controlled. For example, both of the reflective electrode 1 and the transparent electrode 2 are formed with a plurality of stripe-like partial electrodes. Moreover, the extending direction of the stripe-like partial electrodes forming the reflective electrode 1 and the extending direction of the stripe-like partial electrodes forming the transparent electrode 2 are made to intersect with each other. This can form an organic EL device with a plurality of passive matrix driven independent light emitting sections. The intersection of the reflective electrode 1 and the transparent electrode 2 is preferably made to be at right angle.

In the foregoing, the invention was explained by using the bottom emission type organic EL display as shown in FIG. 1J. The invention, however, can be also applied to the case of manufacturing a top emission type organic EL display. An example of the arrangement of such a top emission type organic EL display is shown in each of FIG. 2 and FIG. 3.

Figure 2:
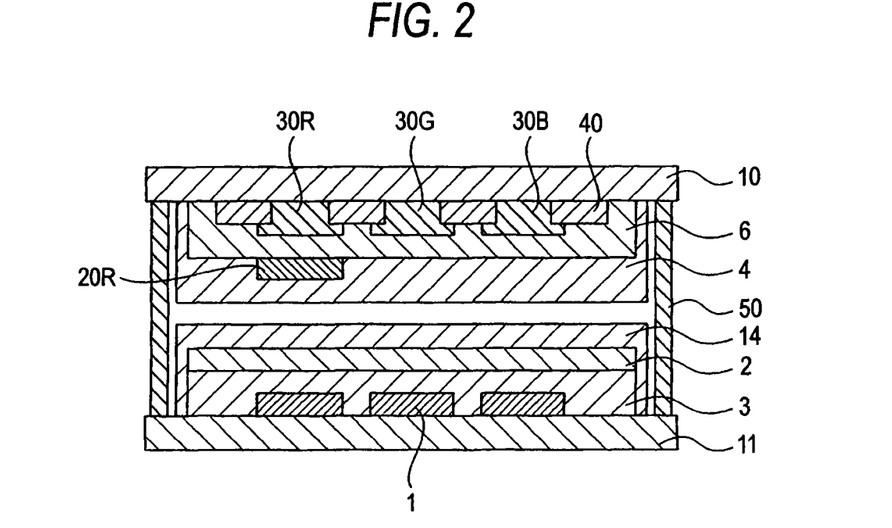
FIG. 2 is a cross sectional view showing an example of the arrangement of a top emission type organic EL display according to the invention.

First, the invention will be explained by using an example of the arrangement shown in FIG. 2. For example, as was explained with reference to FIGS. 1A to 1G, a color conversion filter is formed in which the manufacturing process is completed up to the step of forming the first barrier layer 4. As was explained in the foregoing, the protecting layer 5 is an optionally provided layer. Separately from this, a top emission type organic EL device is formed in which the reflective electrode 1, the organic EL layer 3 and the transparent electrode 2 are formed in the order on the upper surface of a device substrate 11. In the organic EL device, a second barrier layer 14 can be formed. For the material and the forming method of the second barrier layer 14, the same ones as those for the first barrier layer 4 can be used. Moreover, the second barrier layer 14 can be either a single layer or a plurality of layers. By laminating the color conversion filter and the top emission type organic EL device together so that the first barrier layer 4 and the transparent electrode 2 (the second barrier layer 14 when it is presented) are opposite to each other, a top emission type organic EL display as shown in FIG. 2 can be obtained. The reflective electrode 1, the organic EL layer 3 and the transparent electrode 2 can be formed by the above-explained method. The bonding of the color conversion filter and the top emission type organic EL device can be performed by using an adhesion layer 50 provided on the periphery of the substrate. The adhesion layer 50 can be formed, for example, by using a UV hardening adhesive.

Here, the device substrate 11 can be formed by using, in addition to material similar to the transparent substrate 10, opaque material such as silicon or ceramic. Moreover, the organic EL device with this arrangement can be formed into an active matrix drive type device. The active matrix drive type organic EL device can be formed by providing a plurality of switching elements on the device substrate 11, forming the reflective electrode 1 from a plurality of partial electrodes corresponding to pixels or sub-pixels in the light emitting section, connecting a plurality of the switching elements to a plurality of the partial electrodes in a one-to-one correspondence and providing the transparent electrode 2 as an integral type common electrode.

Figure 3:
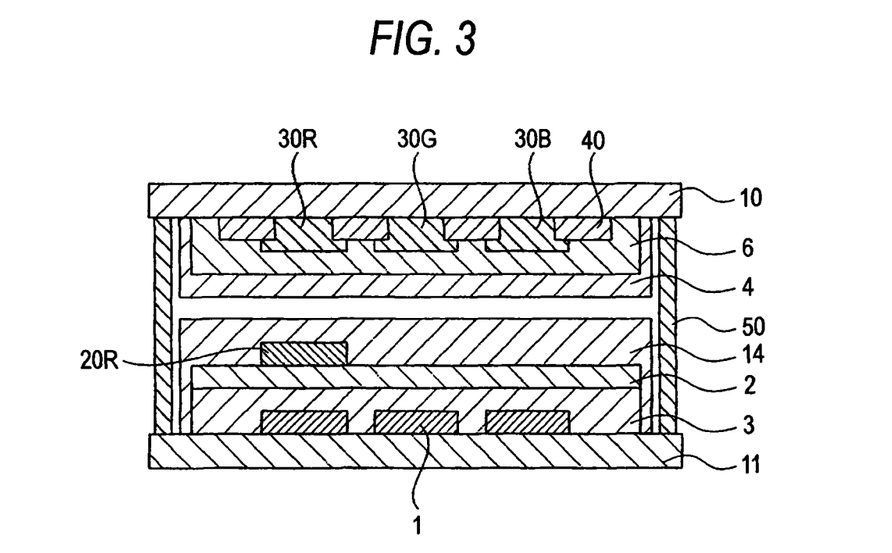
FIG. 3 is a cross sectional view showing another example of the arrangement of a top emission type organic EL display according to the invention.

Alternatively, a top emission type organic EL device can be formed with the arrangement shown in FIG. 3. The color conversion layer 20 is formed on the upper surface of a top emission type organic EL device obtained by forming the reflective electrode 1, the organic EL layer 3 and the transparent electrode 2 on the device substrate 11. Subsequent to this, the thermal cycle nano imprint technique explained with reference FIGS. 1D to 1F is applied to pattern the red color conversion layer 20R. By covering the red color conversion layer 20R and underlying layers thereof by a second barrier layer 14 of the organic EL device, a top emission type organic EL device can be also formed. In this case, the organic EL layer 3 becomes a layer providing elasticity necessary for carrying out the thermal cycle nano imprint technique. If desired, with a barrier layer and a planarization layer provided in the order on the transparent electrode 2, and with the color conversion layer 20 formed on the planarization layer, a thermal cycle nano imprint technique can be carried out for patterning the red color conversion layer 20. In this case, unevenness of the surface can be reduced by the presence of the planarization layer and elasticity necessary for carrying out the thermal cycle nano imprint technique can be made further enhanced. Then, by laminating the top emission type organic EL device and the color filter, provided with the black matrices 40, color filter layers 30R, 30G and 30B and the planarization layer 6 which are explained in FIG. 1A and the first barrier layer 4 explained in FIG. 1G, so that the first barrier layer 4 and the second barrier layer 14 are opposite to each other, a top emission type organic EL display as shown in FIG. 3 can be obtained. The arrangement shown in FIG. 3 differs from the arrangement shown in FIG. 2 in that the second barrier layer 14 rather than the first barrier layer 4 is formed so as to cover the red color conversion layer 20R. Also in this case, the bonding of the color filter and the top emission type organic EL device can be performed by using an adhesion layer 50 provided on the periphery of the device substrate 11.

Example 1

According to procedures in the following processes (1) to (8), a multiple color light emitting organic EL display according to the invention was produced.

(1) Formation of the Color Filter Layer 30

With 1737 glass (manufactured by Corning Inc.) used as the transparent substrate 10, and with black matrix material (CK-7001: manufactured by FUJIFILM Electronic materials Co., Ltd.), red color filter layer material (CR-7001: manufactured by FUJIFILM Electronic materials Co., Ltd.), green color filter layer material (CG-7001: manufactured by FUJIFILM Electronic materials Co., Ltd.) and blue color filter layer material (CB-7001: manufactured by FUJIFILM Electronic materials Co., Ltd.) used thereon, the black matrix 40 and the color filter layers 30R, 30G and 30B are formed thereon. The thickness of each layer was 1 μm.

The dimensions of each of the sub-pixels of the formed color filter layer were 100 μm×30 μm and the spacing between the sub-pixels (namely the inter-pixel spacing) was 10 μm in the longitudinal direction and 5 μm in the lateral direction. Three of the sub-pixels (red, blue and green)

formed one pixel, and 50 pixels were disposed in the longitudinal direction and 50 pixels were disposed in the lateral direction.

(2) Formation of the Planarization Layer 6

The planarization layer 6 was formed with V259PAP, manufactured by Nippon Steel Chemical Co., Ltd., applied so as to cover the color filter layers 30R, 30G and 30B and made hardened. The thickness of the planarization layer 6 was provided as being 2 µm. The upper surface of the obtained planarization layer was flat.

(3) Formation of the Protection Layer 5

On the upper surface of the planarization layer 6, the protection layer 5, formed of an IZO film with a thickness of 200 nm, was obtained by carrying out sputtering. For the sputtering system, an RF-planar magnetron sputtering system was used with IZO used as a target. For a sputtering gas at deposition, Ar gas was used. The substrate temperature at the formation was 80° C.

(4) Formation of the Color Conversion Layer 20

On the upper surface of the protection layer 5, the color conversion layer 20 of $Alq_3$ and DCM-2 was formed by a resistance heating evaporation system. Specifically, by carrying out coevaporation in which $Alq_3$ and DCM-2 were independently heated in separately provided crucibles in the evaporation system, the color conversion layer 20 with a thickness of 400 nm was formed. At that time, the temperatures of the respective crucibles were controlled so that the evaporation speed of $Alq_3$ became 0.3 nm/s and the evaporation speed of DCM-2 became 0.005 nm/s. The color conversion layer 20 in the example included 2 mol % of DCM-2 (the molar ratio of $Alq_3$:DCM-2 is 49:1) based on the total number of component molecules in the color conversion layer 20.

(5) Patterning of the Red Color Conversion Layer 20R

The laminate including the color conversion layer 20 is subsequently carried into a nano imprint system in a vacuum to carry out thermal cycle nano imprint technique in a vacuum. The mold 84, having a pattern in which a plurality of hollows having dimensions of 100 µm×30 µm were spaced 10 µm apart in the longitudinal direction and 75 µm apart in the lateral direction, was heated to a temperature of 150° C. and pressed to the color conversion layer 20 at a pressure of 30 kgf/cm2 (2.94 MPa (gauge pressure)) to pattern the color conversion layer 20. Then, with the mold 84 being pressed, the temperature was lowered down to room temperature for cooling. Following this, oxygen plasma processing was carried out for 20 seconds to form the red color conversion layer 20R having a fine pattern in which a plurality of patterned sections, each with dimensions of 100 µm×30 µm, were spaced 10 µm apart in the longitudinal direction and 75 µm apart in the lateral direction.

(6) Formation of the First Barrier Layer 4

The laminate with the red color conversion layer 20R patterned was transported to a plasma CVD system without breaking the vacuum (in-line processing). Subsequent to this, by using plasma CVD with monosilane ($SiH_4$), ammonia ($NH_3$) and nitrogen ($N_2$) used as source gases, silicon nitride (SiN) with a thickness of 3 µm was made deposited so as to cover the red color conversion layer 20R and the layers formed beneath to form the first barrier layer 4. Here, the substrate temperature at the deposition of SiN was set at 100° C. or less.

(7) Formation of the Organic EL Display

On the upper surface of the first barrier layer 4 formed as described above, the transparent electrode 2, the organic EL layer 3 (three layers of the hole transporting layer, the organic light emitting layer and the electron injecting layer) and the reflective electrode 1 were sequentially formed to form the organic EL device.

Specifically, on the whole upper surface of the first barrier layer, ITO was first deposited by sputtering. On the ITO, resist material (OFRP-800 manufactured by Tokyo Ohka Kogyo Co., Ltd.) was applied. Thereafter, patterning was carried out by photolithography to obtain the transparent electrodes 2, for which a plurality of stripe patterns were spaced 5 µm apart that were made to position at their respective light emitting sections of red, green and blue colors with each made to have a width of 30 µm and a film thickness of 200 nm and extend in the longitudinal direction.

Next to this, the laminate with the transparent electrode 2 being formed was mounted in a resistance heating evaporation system to deposit the hole transporting layer, the organic light emitting layer and the electron injecting layer in the order without breaking the vacuum. At the deposition, the inner pressure of the vacuum chamber in the resistance heating evaporation system is reduced down to $1 \times 10^{-4}$ Pa. For the hole transporting layer, 4,4'-bis[N-(1-naphthyl)-N-phenylamino]biphenyl (α-NPD) was layered to 50 nm. For the organic light emitting layer, 4,4'-bis(2,2'-diphenyl vinyl)-1,1'-biphenyl was layered to 30 nm. For the electron injecting layer, aluminumchelate ($Alq_3$) was layered to 20 nm.

After this, without breaking the vacuum, by using a mask with which a 100 µm stripe pattern extending in the lateral direction and spaced 10 µm apart can be obtained, a Mg/Ag (with a weight ratio of 10:1) layer with a thickness of 200 nm was made deposited to form the reflective electrodes 1, by which the organic EL display was formed.

(8) Sealing of the Organic EL Display

Thus obtained organic EL display was sealed in a glove box under a dry nitrogen atmosphere (with concentrations of both of oxygen and moisture being 10 ppm or less) with the use of sealing glass (not shown) and an adhesion layer of a UV hardening adhesive.

In this way, in the invention, it was possible to pattern the red color conversion layer 20R with dimensions smaller than the lower limit (50 µm width) of the metal mask. This lower limit is a combination of the sub-pixel width and the inter sub-pixel spacing.

Examples 2, 3 and 4, and Comparison Example 5

In the patterning of the color conversion layer 20, with the processes made similar to those in the example 1 except that the respective heating temperatures of the mold 84 were changed, organic EL displays of examples 2, 3 and 4 and comparison example 5 were obtained.

Evaluation 1

Visual evaluation was carried out for the relationship between the patterning of the color conversion layer 20 and the heating temperature of the mold 84 of each of the obtained organic EL displays. The results were shown in the following TABLE 1. In TABLE 1, each of symbols ○ and Δ indicates that the patterned red color conversion layer 20R was obtained (the symbol ○ indicates the case that the pattern has a clear outline and the symbol Δ indicates the case that the pattern has an unclear outline) and a symbol x indicates that no patterned red color conversion layer 20R was obtained. The glass transition temperature Tg, the evaporation temperature and the decomposition temperature of $Alq_3$ are 150° C., approximately 300° C. and approximately 550° C., respectively.

TABLE 1

Relationship between Mold Heating Temperature
and Patterning of Color Conversion Layer

|  | Mold Heating Temperature (° C.) | Patterning of Color Conversion Layer |
|---|---|---|
| Example 1 | 150 | ○ |
| Example 2 | 125 | ○ |
| Example 3 | 175 | ○ |
| Example 4 | 250 | Δ |
| Comparison Example 5 | 110 | x |

As shown above, when the heating temperature of the mold 84 was taken as Tg±100° C. (example 4), although the red color conversion layer 20R could be patterned, the outline of the pattern became unclear. Moreover, when the heating temperature was taken as Tg−40° C. (comparison example 5), no red color conversion layer 20R was patterned. However, when the heating temperature was within the range of Tg±25° C. (examples 1 to 3), the red color conversion layer 20R was well patterned.

Comparison Example 6

Except that a laminate was taken out from the vacuum chamber after the color conversion layer 20 was deposited, made contained in a substrate carrying container and transported to the thermal cycle nano imprint system to be subjected to nano imprint in a nitrogen atmosphere, the laminate was processed in a similar way to that in example 1, by which an organic EL display was obtained.

Evaluation 2

By carrying out visual observation for counting the number of panel leaks about the obtained organic EL display, influences of patterning environments after the color conversion layer 20 was formed were checked and shown in TABLE 2. The number of panel leaks means the number of points that caused leaks in the panel. As the number of panel leaks becomes smaller, the patterning environment becomes better to be desirable for an end product.

TABLE 2

Influence of Patterning Environment after
Formation of Color Conversion Layer 20

|  | Patterning Environment | Number of Panel Leaks |
|---|---|---|
| Example 1 | In Vacuum | 0 |
| Comparison Example 6 | In Nitrogen | 5 |

As shown above, the patterning carried out by the thermal cycle nano imprint technique in a vacuum with the laminate, having the color conversion layer 20 formed, and carried in line without breaking vacuum presented less number of panel leaks than the patterning carried out by the thermal cycle nano imprint technique in nitrogen with the laminate being carried contained in a container between process steps.

Utilizing the patterning method of the invention, it is possible to produce organic EL displays with resolutions and display sizes that were previously unobtainable with the prior art metal mask method. For example, while the metal mask method was limited to sub-pixel widths of 50 μm or greater, the present invention yields sub-pixel widths less than 50 μm and as little as 0.3 μm, although 5 μm may be a more practical commercial limit due to problems in patterning components other than the color conversion layer. Further, while the prior method was limited to inter-sub-pixel spacing of about 10 μm, the present invention produces inter-sub-pixel spacings of 5 μm or less. Similarly, while the overall display dimensions using a metal mask are limited to 550 mm×650 mm due to flexing of the masks which cause distortions, the present invention can produce displays of almost unlimited size and specifically arrays having at least one dimension (either length or width) greater than 650 mm. The only limitation of display size with the present invention is processing equipment ability of laying down the color conversion layer.

While the present invention has been particularly shown and described with reference to preferred embodiments thereof, it will be understood by those skilled in the art that the foregoing and other changes in form and details can be made therein without departing from the spirit and scope of the present invention.

The invention claimed is:

1. A method of patterning a color conversion layer comprising:
   forming the color conversion layer on top of a base; and
   patterning the color conversion layer by carrying out a thermal cycle nano imprint technique.

2. The method of patterning a color conversion layer as claimed in claim 1 further comprising carrying out oxygen plasma processing after patterning the color conversion layer.

3. The method of patterning a color conversion layer as claimed in claim 1 wherein the color conversion layer is formed by vacuum evaporation.

4. The method of patterning a color conversion layer as claimed in claim 1, wherein the color conversion layer consists essentially of a color conversion material.

5. The method of patterning a color conversion layer as claimed in claim 1, further comprising forming a color filter layer on a surface of the base, and forming a planarization layer on top of the color filter layer, wherein the color conversion layer is formed over the planarization layer.

6. The method of patterning a color conversion layer as claimed in claim 5 further comprising forming a protecting layer between the color conversion layer and the planarization layer.

7. The method of patterning a color conversion layer as claimed in claim 1, further comprising forming a barrier layer over the color conversion layer.

8. The method of patterning a color conversion layer as claimed in claim 7, further comprising forming an organic EL layer over the barrier layer.

9. The method of patterning a color conversion layer as claimed in claim 1, wherein the thermal cycle nano imprint technique includes heating a mold formed with a fine pattern, bringing the mold into contact with the color conversion layer, and pressing the mold into the color conversion layer to transfer the fine pattern of the mold onto the color conversion layer.

10. The method of patterning a color conversion layer as claimed in claim 9, wherein the mold is heated to a temperature within a range of the glass transition temperature of the color conversion layer (Tg)±25° C.

11. The method of patterning a color conversion layer as claimed in claim 1 wherein the forming the color conversion layer and the patterning the color conversion layer are carried out in an inline vacuum process.

12. A method of manufacturing an organic EL display comprising:

providing at least two kinds of color filter layers, each transmitting light in a different wavelength region, on a base;

forming a planarization layer over the color filter layers;

forming a color conversion layer over the planarization layer, wherein the color conversion layer absorbs light of a first wavelength and emits light including a second wavelength that differs from the first wavelength; and patterning the color conversion layer by carrying out a thermal cycle nano imprint technique forming a barrier layer over the patterned color conversion layer.

13. A method of manufacturing an organic EL display as claimed in claim 12, further comprising forming an organic EL device over the barrier layer.

14. The method of manufacturing an organic EL display as claimed in claim 12 further comprising forming a protection layer between the planarization layer and the color conversion layer.

15. The method of manufacturing an organic EL display as claimed in claim 12, wherein the thermal cycle nano imprint technique includes heating a mold formed with a fine pattern, bringing the mold into contact with the color conversion layer, and pressing the mold into the color conversion layer to transfer the fine pattern of the mold onto the color conversion layer.

16. The method of manufacturing an organic EL display as claimed in claim 15 wherein the mold is heated to a temperature within a range of the glass transition temperature of the color conversion layer (Tg)±25° C.

17. The method of manufacturing an organic EL display as claimed claim 12 wherein the patterning of the color conversion layer is carried out in a vacuum condition.

18. A method of manufacturing an organic EL display as claimed in claim 12, wherein the base, color filter layers, planarization layer, color conversion layer and barrier layer constitute a color conversion filter structure; and wherein the color conversion filter structure is bonded to a top emission type EL device.

19. A method of manufacturing an organic EL display comprising:

providing a color filter structure by providing at least two kinds of color filter layers, each transmitting light in a different wavelength region, on a base, forming a planarization layer over the color filter layers, and forming a first barrier layer over the planarization layer;

providing an organic EL device by forming an organic EL layer on a device substrate, forming a color conversion layer over the organic EL layer, wherein the color conversion layer absorbs light of a first wavelength and emits light including a second wavelength that differs from the first wavelength, patterning the color conversion layer by carrying out a thermal cycle nano imprint technique, and forming a second barrier layer over the color conversion layer; and bonding the color filter structure to the organic EL device so that the first barrier layer and the second barrier layer are opposite to each other.

20. The method of manufacturing an organic EL display as claimed in claim 19, wherein the thermal cycle nano imprint technique includes heating a mold formed with a fine pattern, bringing the mold into contact with the color conversion layer, and pressing the mold into the color conversion layer to transfer the fine pattern of the mold onto the color conversion layer.

21. The method of manufacturing an organic EL display as claimed in claim 20 wherein the mold is heated to a temperature within a range of the glass transition temperature of the color conversion layer (Tg)±25° C.

22. The method of manufacturing an organic EL display as claimed in claim 19 wherein the patterning the color conversion layer is carried out in a vacuum process.

* * * * *